(12) United States Patent
Wang et al.

(10) Patent No.: US 11,071,200 B2
(45) Date of Patent: Jul. 20, 2021

(54) METAL TRACE

(71) Applicant: WUHAN CHINA STAR OPTOELECTRONICS SEMICONDUCTOR DISPLAY TECHNOLOGY CO., LTD., Wuhan (CN)

(72) Inventors: Peng Wang, Wuhan (CN); Jinxue Weng, Wuhan (CN)

(*) Notice: Subject to any disclaimer, the term of this patent is extended or adjusted under 35 U.S.C. 154(b) by 278 days.

(21) Appl. No.: 16/466,648

(22) PCT Filed: Apr. 11, 2019

(86) PCT No.: PCT/CN2019/082234
§ 371 (c)(1),
(2) Date: Jun. 5, 2019

(87) PCT Pub. No.: WO2020/124883
PCT Pub. Date: Jun. 25, 2020

(65) Prior Publication Data
US 2021/0185796 A1    Jun. 17, 2021

(30) Foreign Application Priority Data
Dec. 19, 2018    (CN) .......................... 201811553919.8

(51) Int. Cl.
H05K 1/02    (2006.01)

(52) U.S. Cl.
CPC ... H05K 1/028 (2013.01); *H05K 2201/10128* (2013.01)

(58) Field of Classification Search
CPC ..................... H05K 1/028; H05K 2201/10128
USPC .......................................................... 174/254
See application file for complete search history.

(56) References Cited

U.S. PATENT DOCUMENTS

| 2004/0142520 | A1  | 7/2004  | Mouli |
| 2016/0035812 | A1* | 2/2016  | Kwon ............... H01L 29/66757 257/40 |
| 2018/0247992 | A1* | 8/2018  | Cho ..................... H01L 23/5283 |
| 2018/0301520 | A1* | 10/2018 | Jin ....................... H01L 27/1218 |

FOREIGN PATENT DOCUMENTS

CN    108807477 A    11/2018

* cited by examiner

*Primary Examiner* — Sherman Ng

(57) ABSTRACT

A metal trace is provided to include a plurality of metal traces disposed side by side on a bending region, and each of the metal traces includes a trace body, and the trace body is provided with a plurality of through holes, and the plurality of through holes are used to reduce bending stress received by the metal traces, and the plurality of through holes are spaced apart along an extending direction of the trace body. The plurality of through holes are disposed on the trace body to reduce bending stress on the metal traces.

6 Claims, 4 Drawing Sheets

METAL TRACE

BACKGROUND OF INVENTION

Field of Invention

The present invention relates to a metal trace, and more particularly, to a metal trace.

Description of Prior Art

Currently, one problem faced by a bending process of display panels is that metal traces of a bending region are cracked and broken after bent. The metal traces are cracked and broken because of stress concentrated in the bending region during the metal traces are bent. Now, the metal traces of the bending region are formed as a Ti—Al—Ti metal laminated structure, which is easy to cause stress concentration. Before a material of the metal traces cannot be effectively replaced, the stress concentration can only be reduced by improving other characteristics of the metal traces.

SUMMARY OF INVENTION

The present invention provides a metal trace used for a bending region to solve a technical problem that the existing metal trace is easily to be cracked and broken after being bent in the bending region.

In one embodiment, a metal trace includes a plurality of the metal traces disposed side by side on a bending region, and each of the metal traces includes a trace body, and the trace body is provided with a plurality of through holes, and the plurality of through holes are used to reduce bending stress received by the metal traces, and the plurality of through holes are spaced apart along an extending direction of the trace body. The trace body includes a first long side and a second long side respectively formed by two side edges of the trace body, and the first long side and the second long side are oppositely disposed, and an extending direction of the first long side and the second long side is same as the extending direction of the trace body, and the plurality of through holes are disposed between the first long side and the second long side. The first long side is a straight side or a non-linear side, and the second long side is a straight side or a non-linear side. The first long side and the second long side of each of the metal traces positioned in the bending region are curved sides. A distance between two adjacent metal traces is increased from two side edges of the bending region toward a center line of the bending region. The bending region includes an intermediate region, a first edge region, and a second edge region. The first edge region and the second edge region are respectively disposed on opposite sides of the intermediate region. The metal trace disposed in the intermediate region is a first trace, the metal trace disposed in the first edge region is a second trace, and the metal trace disposed in the second edge region is a third trace. A through hole density of the first trace is greater than a through hole density of the second trace and a through hole density of the third trace.

In one embodiment, the plurality of through holes each have a circular shape, and a diameter of each through hole of the first trace is larger than a diameter of each through hole of the second trace and a diameter of each through hole of the third trace.

In one embodiment, the plurality of through holes each have an elliptical shape, and the plurality of through holes each comprise a long axis and a short axis, and an extending direction of the long axis is same as an extending direction of the metal trace, and a length ratio of the long axis to the short axis of each through hole of the first trace is greater than a length ratio of the long axis to the short axis of each through hole of the second trace and a length ratio of the long axis to the short axis of each through hole of the third trace.

In one embodiment, a shape of each through hole of the first trace is different from a shape of each through hole of the second trace and a shape of each through hole of the third trace.

In one embodiment, the shape of the each through hole of the first trace is an ellipsoid, and the shape of the each through hole of the second trace and the shape of the each through hole of the third trace are diamonds.

In another embodiment, a metal trace includes a plurality of the metal traces disposed side by side on a bending region, and each of the metal traces comprises a trace body, and the trace body is provided with a plurality of through holes, and each of the through holes is used to reduce bending stress received by the metal trace, and the plurality of through holes are spaced apart along an extending direction of the trace body.

In one embodiment, the trace body includes a first long side and a second long side respectively formed by at two side edges of the trace body, and the first long side and the second long side are oppositely disposed, and an extending direction of the first long side and the second long side is same as the extending direction of the trace body, and the plurality of through holes are disposed between the first long side and the second long side, and the first long side is a straight side or a non-linear side, and the second long side is a straight side or a non-linear side.

In one embodiment, the first long side and the second long side of each of the metal traces positioned in the bending region are straight sides.

In one embodiment, the first long side and the second long side of each of the metal traces disposed in the bending region are curved sides.

In one embodiment, the bending region includes an intermediate region, a first edge region, and a second edge region. The first edge region and the second edge region are respectively disposed on opposite sides of the intermediate region. A metal trace disposed in the intermediate region is a first trace, the metal trace disposed in the first edge region is a second trace, and the metal trace disposed in the second edge region is a third trace. A first long side and a second long side of each the first trace are curved sides, a first long side of each the second trace is a straight side, a second long side of each the second trace is a curved side, a first long side of each the third trace is a curved side, and a second long side of each the third trace is a straight side. The first long side of each the second trace is away from each the first trace, and the second long side of each the third trace is away from each the first trace.

In one embodiment, a distance between two adjacent metal traces is increased from two side edges of the bending region toward a center line of the bending region.

In one embodiment, the bending region includes an intermediate region, a first edge region, and a second edge region. The first edge region and the second edge region are respectively disposed on opposite sides of the intermediate region. The metal trace disposed in the intermediate region is a first trace, the metal trace disposed in the first edge region is a second trace, and the metal trace disposed in the second edge region is a third trace. A through hole density of the first trace is greater than a through hole density of the second trace and a through hole density of the third trace.

In one embodiment, the bending region includes an intermediate region, a first edge region, and a second edge region. The first edge region and the second edge region are respectively disposed on opposite sides of the intermediate region. The metal trace disposed in the intermediate region is a first trace, the metal trace disposed in the first edge region is a second trace, and the metal trace disposed in the second edge region is a third trace. The plurality of through holes each have a circular shape, and a diameter of each through hole of the first trace is larger than a diameter of each through hole of the second trace and a diameter of each through hole of the third trace.

In one embodiment, the bending region includes an intermediate region, a first edge region, and a second edge region. The first edge region and the second edge region are respectively disposed on opposite sides of the intermediate region. The metal trace disposed in the intermediate region is a first trace, the metal trace disposed in the first edge region is a second trace, and the metal trace disposed in the second edge region is a third trace. The plurality of through holes each have an elliptical shape, and each through hole includes a long axis and a short axis, and an extending direction of the long axis is same as an extending direction of the metal trace, and a ratio of the long axis to the short axis of each through hole of the first trace is greater than a ratio of the long axis to the short axis of each through hole of the second trace and a ratio of the long axis to the short axis of each through hole of the third trace.

In one embodiment, the bending region includes an intermediate region, a first edge region, and a second edge region. The first edge region and the second edge region are respectively disposed on opposite sides of the intermediate region. The metal trace disposed in the intermediate region is a first trace, the metal trace disposed in the first edge region is a second trace, and the metal trace disposed in the second edge region is a third trace. A shape of each through hole of the first trace is different from a shape of each through hole of the second trace and a shape of each through hole of the third trace.

In one embodiment, the shape of the each through hole of the first trace is an ellipsoid, and the shape of the each through hole of the second trace and the shape of the each through hole of the third trace are diamonds.

Compared with the metal trace of the prior art, the metal trace of the embodiment in the present invention reduces the bending stress received by the metal trace by defining a through hole in the trace body, so that it can solve a technical problem of the metal trace of the bending region being easily cracked and broken after being bent.

BRIEF DESCRIPTION OF DRAWINGS

In order to more clearly illustrate embodiments or technical solutions in the present invention, the drawings used in the description of the embodiments or current technology will be briefly described below. Obviously, the drawings in the following description are merely some embodiments of the present invention. A person skilled in the art may also obtain other drawings without any creative efforts.

DETAILED DESCRIPTION OF PREFERRED EMBODIMENTS

Figure 1:
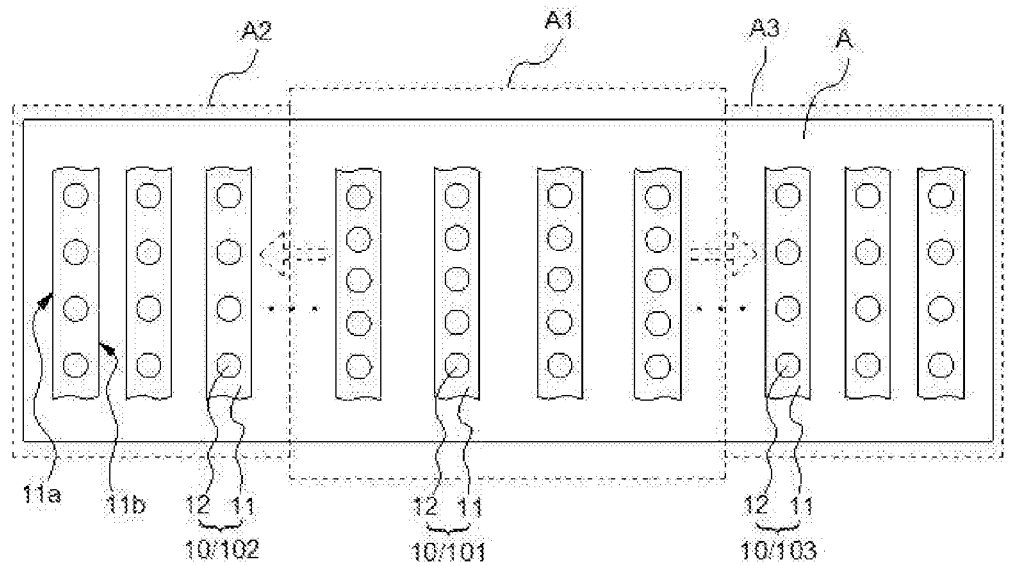
FIG. 1 is a schematic structural view of a metal trace in a bending region according to a first embodiment of the present invention.

Please refer to the drawings, in which the same reference numerals represent the same component. The following description is based on the specific embodiments of the present invention as illustrated, and should not be construed as limiting the specific embodiments that are not described herein.

Referring to FIG. 1, it is a schematic structural view of a metal trace in a bending region according to a first embodiment of the present invention. In the first embodiment, a plurality of metal traces 10 disposed side by side on a bending region A. The bending region A is positioned on a display panel.

In the first embodiment, each of the metal traces 10 includes a trace body 11, and the trace body 11 is provided with a plurality of through holes 12. The plurality of through holes 12 are used to reduce bending stress received by the metal traces. The plurality of through holes 12 are spaced apart along an extending direction of the trace body 11.

In the first embodiment, the plurality of through holes 12 are disposed on the trace body 11 to reduce bending stress received by the metal traces 10. When the metal traces 10 are subjected to bending stress, the bending stress is divided into compressive stress and tensile stress. The trace body 11 is stretched and deformed along a direction of the tensile stress. Meanwhile, the plurality of through holes 12 are also stretched and deformed along the direction of the tensile stress. That is, a part of the plurality of through holes 12 parallel to the tensile direction is stretched, and another part of the plurality of through holes 12 perpendicular to the tensile direction generates compression to the inside of the plurality of through holes 12. Therefore, the plurality of through holes 12 are subjected to tensile stress to have a deformation which reduces bending stress received by the metal traces 10.

It should be noted that the first embodiment of the present invention is described by taking the direction of the tensile stress perpendicular to the metal traces as an example, but is not limited thereto.

In the first embodiment, the trace body 11 includes a first long side 11a and a second long side 11b respectively formed by two side edges of the trace body, and the first long side 11a and the second long side 11b are oppositely disposed, and an extending direction of the first long side 11a and the second long side 11b is same as with the extending direction of the trace body 11, and the plurality of through holes 12 are disposed between the first long side and the second long side.

The first long side 11a is a straight side or a non-linear side, and the second long side 11b is a straight side or a non-linear side. That is, the first long side 11a may be one of a straight side or a non-linear side, and the second long side 11b may be one of a straight side or a non-straight side. The non-linear side may be a curved side or a polygonal side, such as a wavy curved side, a zigzag polygonal side, and the like.

In addition, a shape of the plurality of through holes 12 may be one of a circle, an ellipsoid, a diamond, and the like. The shape of the plurality of through holes 12 defined in the metal traces 10 may be the same or different.

In the first embodiment, an axis of the plurality through holes 12 overlaps with a central axis of the trace body 11. Such an arrangement improves the uniformity of the force of the metal traces 10. Therefore, a stress concentration is avoided and a bending performance of the metal traces is improved.

In the first embodiment, the first long side 11a and the second long side 11b of each metal trace 10 in the bending region A are both straight sides.

In the first embodiment, the bending region includes an intermediate region A1, a first edge region A2, and a second edge region A3. The first edge region A2 and the second edge region A3 are respectively disposed on opposite sides of the intermediate region A1.

A distance between two adjacent metal traces 10 is increased from two side edges of the bending region A toward a center line of the bending region. When the bending region A is bent, the direction of the tensile stress of the bending stress is perpendicular to the extending direction of the metal traces 10. A bending stress received by the metal traces 10 disposed in the intermediate region A1 is greater than a bending stress received by the metal traces 10 disposed in the first edge region A2 and the second edge region A3.

Therefore, a distance between two adjacent metal traces 10 is increased from two side edges of the bending region A toward a center line of the bending region, which reduces the metal traces subjected to a greater bending stress, so that the metal traces 10 are protected, and the tensile stress received by the metal traces 10 disposed in the entire bending region A is balanced.

Specifically, a metal trace 10 disposed in the intermediate region A1 is a first trace 101, the metal trace 10 disposed in the first edge region is a second trace 102, and the metal trace 10 disposed in the second edge region is a third trace 103.

A through hole 12 density of the first trace 101 is greater than a through hole 12 density of the second trace 102 and a through hole 12 density of the third trace 103. The through hole density is a number of through holes per unit area.

A bending stress received by the first metal trace 101 disposed in the intermediate region A1 is greater than a bending stress received by the second metal trace 102 disposed in the first edge region A2 and a bending stress received by the third metal trace 103 disposed in the third edge region A3. Therefore, the bending stress received by the first trace 101 is reduced by increasing the through hole density of the first trace 101, and the tensile stress received by the metal trace 10 disposed in the entire bending region A is balanced.

Figure 2:
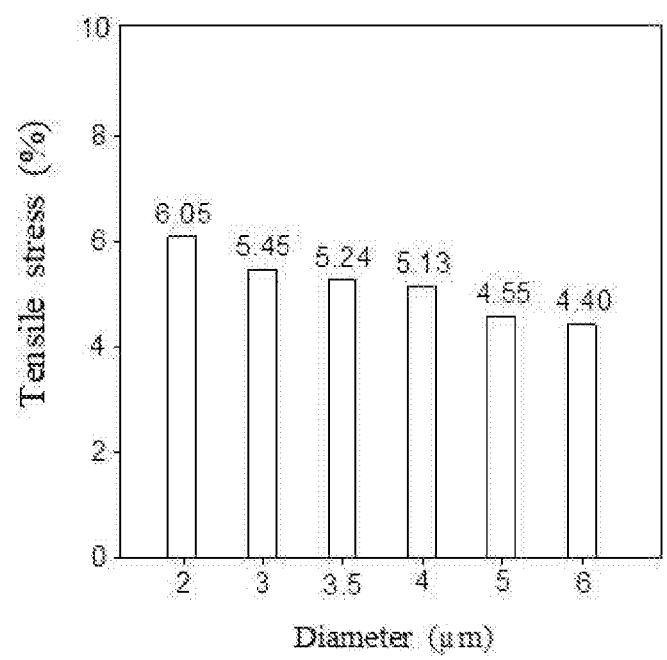
FIG. 2 is a column chart of tensile stresses received by metal traces corresponding to through holes having different diameters when the through holes are in circular shapes.

Referring to FIG. 2, which is a column chart of tensile stresses received by metal traces corresponding to through holes having different diameters when the through holes are in circular shapes. As shown in FIG. 2, as the diameter of the through hole is larger, the tensile stress received by the metal trace is lesser. Thus, the through hole 12 is a circular shape. The diameter of the through hole 12 of the first trace 101 is larger than the diameter of the through hole 12 of the second trace 102 and the diameter of the through hole 12 of the third trace 103, so that the bending stress received by the first trace 101 is reduced. Furthermore, the tensile stress received by the metal trace 10 disposed in the entire bending region A is balanced.

Figure 3:
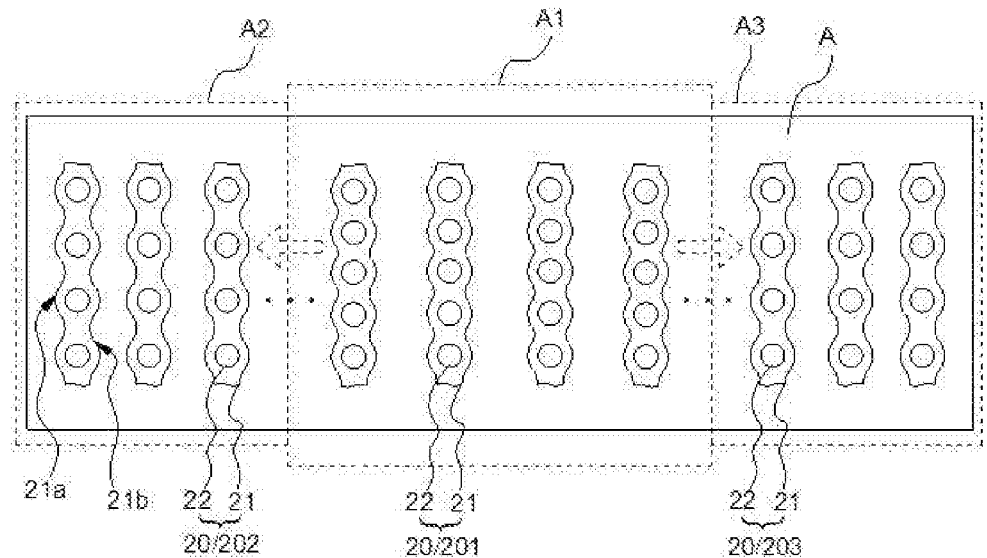
FIG. 3 is a schematic structural view of a metal trace in a bending region according to a second embodiment of the present invention.

Referring to FIG. 3, it is a schematic structural view of a metal trace in a bending region according to a second embodiment of the present invention. Each of the metal traces 20 includes a trace body 21, and the trace body 21 is provided with a plurality of through holes 22. The difference between the second embodiment and the first embodiment is described as follows.

In the bending region A, a first long side 21a and a second long side 21b of each the metal trace 20 are curved sides. Because a first long side 21a and a second long side 21b of each the metal trace 20 are curved sides, the tensile stress received by the metal trace 20 is reduced.

The arrangement of the metal traces 20 disposed in the bending region A and the through holes 22 defined in the corresponding metal traces 20 are identical to the first embodiment. For details, please refer to the content of the first embodiment.

Figure 4:
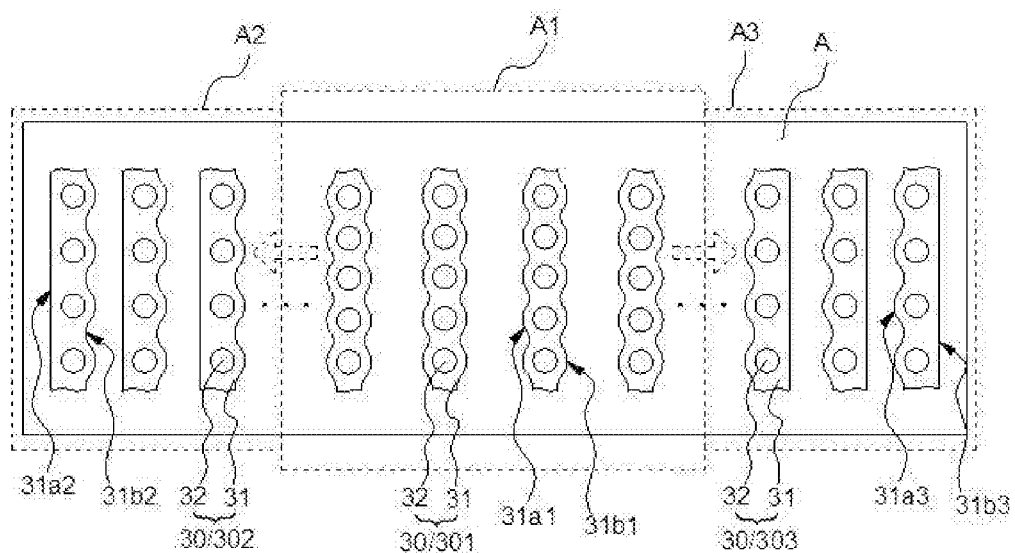
FIG. 4 is a schematic structural view of a metal trace in a bending region according to a third embodiment of the present invention.

Referring to FIG. 4, it is a schematic structural view of a metal trace in a bending region according to a third embodiment of the present invention. Each of metal traces 30 includes a trace body 31. The trace body 31 is provided with a plurality of through holes 32. The bending region A includes an intermediate region A1, a first edge region A2, and a second edge region A3. The first edge region A2 and the second edge region A3 are respectively disposed on opposite sides of the intermediate region A1. The metal trace disposed in the intermediate region A1 is a first trace 301, the metal trace disposed in the first edge region A2 is a second trace 302, and the metal trace disposed in the second edge region A3 is a third trace 303.

The difference between the third embodiment and the first embodiment is described as follows.

A first long side 31a1 and a second long side 31b1 of each the first trace 301 are curved sides. A first long side 31a2 of each the second trace 302 is a straight side, and a second long side 31b2 of each the second trace 302 is a curved side. A first long side 31a3 of each the third trace 303 is a curved side, and a second long side 31b3 of each the third trace 303 is a straight side.

The first long side 31a2 of each the second trace 302 is away from the first trace 301. The second long side 31b3 of each the third trace 303 is away from the first trace 301.

In the bending region A, the intermediate region A1 receives maximum bending stress, and the first edge region A2 and the second edge region A3 are subjected to relatively less bending stress. Therefore, the first trace 301 disposed in the intermediate region A1 adopts a hyperbolic curve structure to further reduce the tensile stress received by the first trace 301. The second trace 302 disposed in the first edge region A2 and the third trace 303 disposed in the second edge region A3 adopt a structure having one straight edge and one curved edge so as to correspondingly reduce the tensile stress received by the second trace 302 and the third trace 303. Therefore, the tensile stress received by the metal trace 30 disposed in the entire bending region A is balanced.

Figure 5:
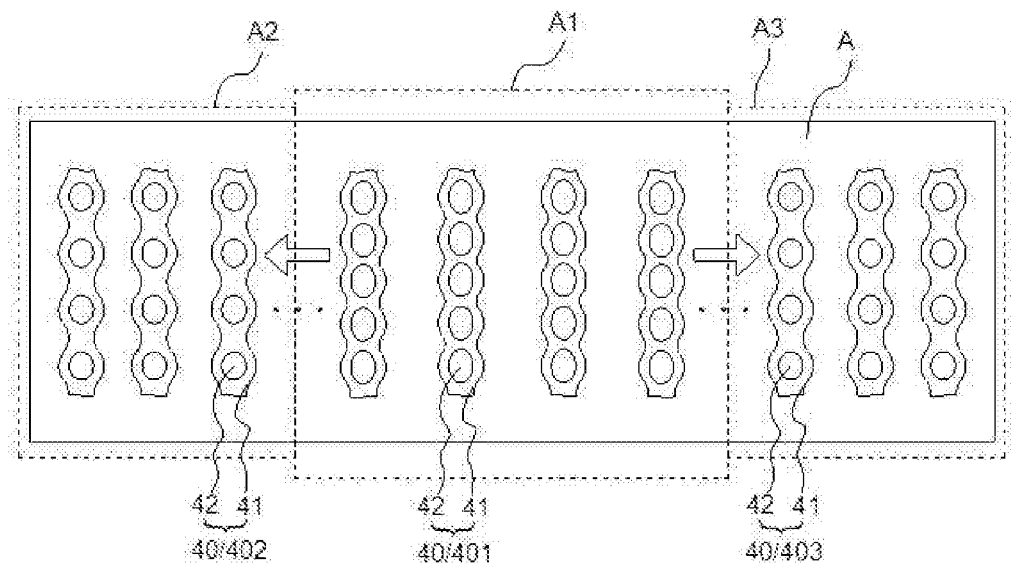
FIG. 5 is a schematic structural view of a metal trace in a bending region according to a fourth embodiment of the present invention.

Referring to FIG. 5, it is a schematic structural view of a metal trace in a bending region according to a fourth embodiment of the present invention. Each of metal traces 40 includes a trace body 41. The trace body 41 is provided with a plurality of through holes 42. The bending region A includes an intermediate region A1, a first edge region A2, and a second edge region A3. The first edge region A2 and the second edge region A3 are respectively disposed on opposite sides of the intermediate region A1. The metal trace disposed in the intermediate region A1 is a first trace 401, the metal trace disposed in the first edge region A2 is a second trace 402, and the metal trace disposed in the second edge region A3 is a third trace 403.

The difference between the fourth embodiment and the second embodiment is described as follows.

A plurality of through holes 42 each have an elliptical shape, and the plurality of through holes 42 each includes a long axis and a short axis, and an extending direction of the long axis is same as with an extending direction of a metal trace 40, and a length ratio of the long axis to the short axis of each through hole 42 of the first trace 401 is greater than a length ratio of the long axis to the short axis of each through hole 42 of the second trace 402 and a length ratio of the long axis to the short axis of each through hole 42 of the third trace 403.

Figure 6:
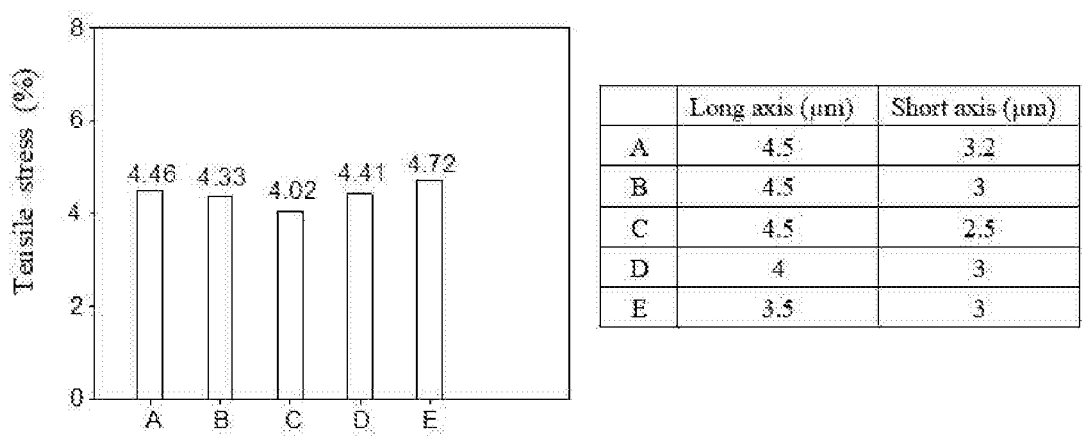
FIG. 6 is a column chart of the tensile stress received by metal traces corresponding to through holes having different length ratios of long axis to short axis when the through holes are elliptically shaped.

Referring to FIG. 6, it is a column chart of the tensile stress received by metal traces corresponding to through holes having different length ratios of long axis to short axis when the through holes are elliptically shaped. As shown in FIG. 6, as the length ratio of the through hole 42 is larger, the tensile stress received by the metal trace 40 corresponding to the through hole 42 is less. Because a length ratio of the long axis to the short axis of each through hole 42 of the first trace 401 is greater than a length ratio of the long axis to the short axis of each through hole 42 of the second trace 402 and a length ratio of the long axis to the short axis of each through hole 43 of the third trace 403, the bending stress received by the first trace 401 is reduced. Therefore, the tensile stress received by the metal trace 40 disposed in the entire bending region A is balanced.

Of course, the structure of the metal traces is identical to the structures of the first embodiment and the third embodiment except for the shape of the through holes. For details, please refer to the contents of the first embodiment, second embodiment, and third embodiment.

Figure 7:
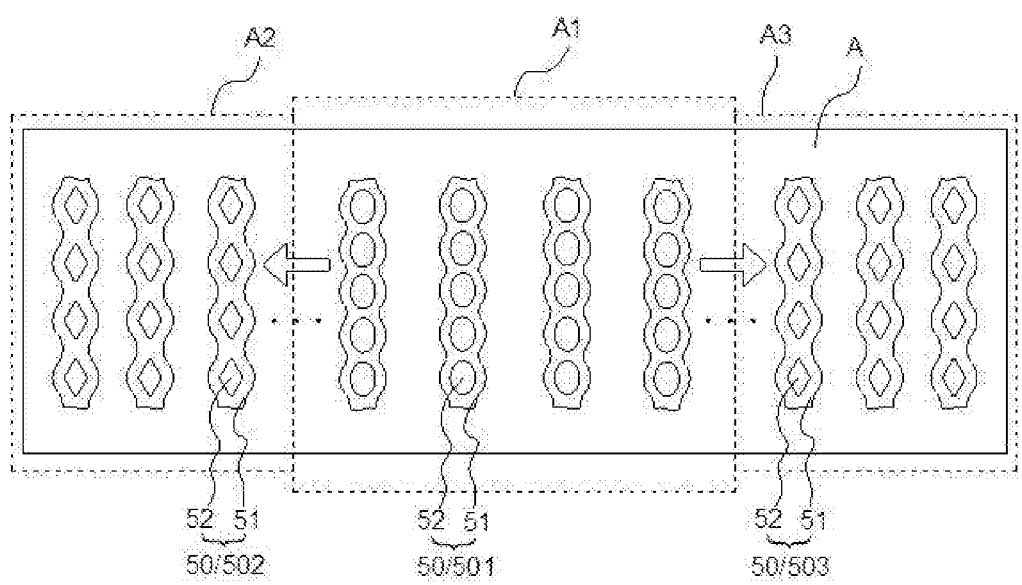
FIG. 7 is a schematic structural view of a metal trace in a bending region according to a fifth embodiment of the present invention.

Referring to FIG. 7, it is a schematic structural view of a metal trace in a bending region according to a fifth embodiment of the present invention. Each of metal traces 50 includes a trace body 51. The trace body 51 is provided with a plurality of through holes 52. The bending region A includes an intermediate region A1, a first edge region A2, and a second edge region A3. The first edge region A2 and the second edge region A3 are respectively disposed on opposite sides of the intermediate region A1. The metal trace disposed in the intermediate region A1 is a first trace 501, the metal trace disposed in the first edge region A2 is a second trace 502, and the metal trace disposed in the second edge region A3 is a third trace 503.

The difference between the fifth embodiment and the second embodiment is described as follows.

A shape of each through hole of a first trace 501 is different from a shape of each through hole of a second trace 502 and a shape of each through hole of a third trace 503.

In the fifth embodiment, the shape of the each through hole of the first trace 501 is an ellipsoid, and the shape of the each through hole of the second trace 502 and the shape of the each through hole of the third trace 503 are diamonds.

A width of the elliptical through holes is identical to a width of the diamond through holes based on the through holes having the same opening area. The metal trace having the elliptical through holes receives a tensile stress greater than a tensile stress received by the metal trace having the diamond through holes. Because the shape of the through hole of the first trace 501 is an ellipsoid and the shape of the through hole of the second trace 502 and the shape of the through hole of the third trace 503 are diamonds, the bending stress received by the first trace 501 is reduced, Therefore, the tensile stress received by the metal trace 50 disposed in the entire bending region A is balanced.

In some embodiments, the shape of the each through hole of the first trace is a circle, and the shape of the each through hole of the second trace and the shape of the each through hole of the third trace are ellipsoids or diamonds. A width of circular through holes is identical to a width of elliptical through holes based on the through holes having the same opening area. The metal trace having the circular through holes receives a tensile stress greater than a tensile stress received by the metal trace having the elliptical through holes.

Of course, the structure of the metal traces is identical to the structures of the first embodiment and the third embodiment except for the shape of the through holes. For details, please refer to the contents of the first embodiment, second embodiment, and third embodiment.

Compared with the metal trace of the prior art, the metal trace of the embodiment in the present invention reduces the bending stress received by the metal trace by defining a through hole in the trace body, so that it can solve a technical problem of the metal trace of the bending region being easily cracked and broken after being bent.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A metal trace, comprising:
a plurality of metal traces disposed side by side on a bending region, wherein each of the metal traces comprises a trace body, and the trace body is provided with a plurality of through holes, the plurality of through holes are spaced apart along an extending direction of the trace body;
wherein the trace body comprises a first long side and a second long side respectively formed by two side edges of the trace body, and the first long side and the second long side are oppositely disposed, and an extending direction of the first long side and the second long side is same as the extending direction of the trace body, and the plurality of through holes are disposed between the first long side and the second long side;
wherein the first long side is a straight side or a non-linear side, and the second long side is a straight side or a non-linear side;
wherein the first long side and the second long side of each of the metal traces positioned in the bending region are curved sides;
wherein a distance between two adjacent metal traces is increased from two side edges of the bending region toward a center line of the bending region;
wherein the bending region comprises an intermediate region, a first edge region, and a second edge region, and the first edge region and the second edge region are respectively disposed on opposite sides of the intermediate region;

wherein the metal trace disposed in the intermediate region is a first trace, the metal trace disposed in the first edge region is a second trace, and the metal trace disposed in the second edge region is a third trace; and wherein a through hole density of the first trace is greater than a through hole density of the second trace and a through hole density of the third trace.

2. The metal trace according to claim 1, wherein the plurality of through holes each have a circular shape, and a diameter of each through hole of the first trace is larger than a diameter of each through hole of the second trace and a diameter of each through hole of the third trace.

3. The metal trace according to claim 1, wherein the plurality of through holes each have an elliptical shape, and the plurality of through holes each comprise a long axis and a short axis, and an extending direction of the long axis is same as an extending direction of the metal trace, and a length ratio of the long axis to the short axis of each through hole of the first trace is greater than a length ratio of the long axis to the short axis of each through hole of the second trace and a length ratio of the long axis to the short axis of each through hole of the third trace.

4. The metal trace according to claim 1, wherein a shape of each through hole of the first trace is different from a shape of each through hole of the second trace and a shape of each through hole of the third trace.

5. The metal trace according to claim 4, wherein the shape of the each through hole of the first trace is an ellipsoid, and the shape of the each through hole of the second trace and the shape of the each through hole of the third trace are diamonds.

6. A metal trace, comprising:
a plurality of metal traces disposed side by side on a bending region, wherein each of the metal traces comprises a trace body, and the trace body is provided with a plurality of through holes, and each of the through holes is used to reduce bending stress received by the metal trace, and the plurality of through holes are spaced apart along an extending direction of the trace body, wherein the trace body comprises a first long side and a second long side respectively formed by at two side edges of the trace body, and the first long side and the second long side are oppositely disposed, and an extending direction of the first long side and the second long side is same as the extending direction of the trace body, and the plurality of through holes are disposed between the first long side and the second long side; and wherein the first long side is a straight side or a non-linear side, and the second long side is a straight side or a non-linear side, wherein the first long side and the second long side of each of the metal traces positioned in the bending region are straight sides, wherein a distance between two adjacent metal traces is increased from two side edges of the bending region toward a center line of the bending region, wherein the bending region comprises an intermediate region, a first edge region, and a second edge region, and the first edge region and the second edge region are respectively disposed on opposite sides of the intermediate region;

wherein the metal trace disposed in the intermediate region is a first trace, the metal trace disposed in the first edge region is a second trace, and the metal trace disposed in the second edge region is a third trace; and wherein a through hole density of the first trace is greater than a through hole density of the second trace and a through hole density of the third trace.

* * * * *